US012218530B2

(12) United States Patent
Yang et al.

(10) Patent No.: US 12,218,530 B2
(45) Date of Patent: Feb. 4, 2025

(54) SYSTEM AND METHOD FOR MANAGING BATTERY

(71) Applicant: LG ENERGY SOLUTION, LTD., Seoul (KR)

(72) Inventors: Seong Yeol Yang, Daejeon (KR); Ji Won Hwang, Daejeon (KR); Chan Ha Park, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 562 days.

(21) Appl. No.: 17/615,955

(22) PCT Filed: Jun. 30, 2020

(86) PCT No.: PCT/KR2020/008546
§ 371 (c)(1),
(2) Date: Dec. 2, 2021

(87) PCT Pub. No.: WO2021/002658
PCT Pub. Date: Jan. 7, 2021

(65) Prior Publication Data
US 2022/0329086 A1 Oct. 13, 2022

(30) Foreign Application Priority Data

Jul. 3, 2019 (KR) .................. 10-2019-0080269

(51) Int. Cl.
H02J 7/00 (2006.01)
G01R 31/36 (2020.01)
(Continued)

(52) U.S. Cl.
CPC ...... H02J 7/00032 (2020.01); G01R 31/3644 (2013.01); G01R 31/371 (2019.01);
(Continued)

(58) Field of Classification Search
CPC .. H02J 7/00032; G01R 31/371; H01M 10/425
See application file for complete search history.

(56) References Cited

U.S. PATENT DOCUMENTS

2013/0271072 A1 10/2013 Lee et al.
2014/0327403 A1 11/2014 Yokoura et al.
(Continued)

FOREIGN PATENT DOCUMENTS

JP 2012-182903 A 9/2012
JP 2013-541320 A 10/2013
(Continued)

OTHER PUBLICATIONS

European Search Report Application No. 20834303.8 issued on Jun. 30, 2022.
(Continued)

Primary Examiner — Robert Grant
(74) Attorney, Agent, or Firm — Birch, Stewart, Kolasch & Birch, LLP

(57) ABSTRACT

Discussed is a system for managing a battery, the system including a wireless communication unit that communicates with a first upper-level battery management system performing communication using a first communication channel, a communication abnormality detection unit that detects a communication abnormality of the first upper-level battery management system, and a channel change unit that changes the communication channel of the wireless communication unit to a second communication channel different from the first communication channel when the communication abnormality of the first upper-level battery management system is detected by the communication abnormality detection unit.

15 Claims, 8 Drawing Sheets

(51) Int. Cl.
*G01R 31/371* (2019.01)
*H01M 10/42* (2006.01)
*H01M 10/48* (2006.01)

(52) U.S. Cl.
CPC ....... *H01M 10/425* (2013.01); *H01M 10/482* (2013.01); *H01M 2010/4271* (2013.01); *H01M 2010/4278* (2013.01)

(56) References Cited

U.S. PATENT DOCUMENTS

| | | | |
|---|---|---|---|
| 2014/0347014 A1* | 11/2014 | Lee | H02J 7/0047 320/134 |
| 2015/0028816 A1 | 1/2015 | Lee | |
| 2016/0056510 A1 | 2/2016 | Takeuchi et al. | |
| 2016/0268642 A1 | 9/2016 | Yamazoe et al. | |
| 2019/0098558 A1 | 3/2019 | Yanagida | |
| 2019/0237980 A1 | 8/2019 | Yang | |

FOREIGN PATENT DOCUMENTS

| | | | |
|---|---|---|---|
| JP | 2016-12954 | A | 1/2016 |
| JP | 6228552 | B2 | 11/2017 |
| JP | 6494567 | B2 | 4/2019 |
| KR | 10-1588664 | B1 | 1/2016 |
| KR | 10-2016-0019237 | A | 2/2016 |
| KR | 10-2016-0069397 | A | 6/2016 |
| KR | 10-2016-0073109 | A | 6/2016 |
| KR | 10-2016-0092718 | A | 8/2016 |
| KR | 10-2018-0009569 | A | 1/2018 |
| WO | WO 2011/108862 | A2 | 9/2011 |
| WO | WO 2014/103008 | A1 | 7/2014 |
| WO | WO 2015/189898 | A1 | 12/2015 |

OTHER PUBLICATIONS

International Search Report (PCT/ISA/210) issued in PCT/KR2020/008546, dated Sep. 29, 2020.

* cited by examiner

SYSTEM AND METHOD FOR MANAGING BATTERY

TECHNICAL FIELD

Cross-reference to Related Applications

This application claims the benefit of Korean Patent Application No. 10-2019-0080269, filed on Jul. 3, 2019, in the Korean Intellectual Property Office, the disclosure of which is incorporated herein in its entirety by reference.

Technical Field

The present invention relates to a system and method for managing a battery for performing communication with an upper-level controller through other upper-level battery management system when a communication abnormality occurs in an associated upper-level battery management system.

BACKGROUND ART

Recently, research and development on secondary batteries are being actively conducted. Here, the secondary battery is a battery capable of charging and discharging, and is meant to include all of a conventional Ni/Cd battery, Ni/MH battery, etc. and a recent lithium-ion battery. Among the secondary batteries, the lithium-ion battery has an advantage of having much higher energy density compared to the conventional Ni/Cd battery, Ni/MH battery, etc. In addition, the lithium-ion battery can be manufactured in a small size and light weight, and thus the lithium-ion battery is used as a power source for a mobile device. In addition, the lithium-ion battery is attracting attention as a next-generation energy storage medium as its range of use has been expanded to a power source for an electric vehicle.

In addition, the secondary battery is generally used as a battery pack including a battery module in which a plurality of battery cells are connected in series and/or in parallel. In addition, a state and operation of the battery pack are managed and controlled by a battery management system (BMS).

A plurality of battery modules are connected in series/in parallel to configure a battery rack, and a plurality of battery racks are connected in parallel to configure a battery bank. Such a battery bank can be used as an energy storage system (ESS). Each battery module is monitored and controlled by a corresponding slave BMS. A master BMS, which is the upper-most level controller in each battery rack, monitors and controls each slave BMS, and monitors and controls the entire battery rack state based on information obtained from the slave BMS.

In this case, in the battery management system for ESS, data transmission and reception between the upper-level battery management system and a lower-level battery management system are mostly made in a tree structure. In such a tree structure, when communication cannot be performed because an abnormality occurs in an intermediate path, there was a problem that communication performance between the lower-level battery management system and the upper-level controller becomes disabled.

In addition, in order to prevent such disabling of communication, a communication structure between the upper-level and lower-level battery management systems should be equipped with an additional interface to perform communication in a mesh structure rather than the tree structure, which has problems such as laying, managing, etc. of additional cables during installation as well as development.

DISCLOSURE OF THE INVENTION

Technical Problem

An object of the present invention is to provide a battery management system and a battery management method that maintain continuity of communication without additional configuration even if a communication abnormality occurs when performing communication in the tree structure between the upper-level and lower-level battery management systems.

Technical Solution

A system for managing a battery according to an embodiment of the present invention includes a wireless communication unit that communicates with a first upper-level battery management system performing communication using a first communication channel, a communication abnormality detection unit that detects a communication abnormality of the first upper-level battery management system, and a channel change unit that changes the communication channel of the wireless communication unit to a second communication channel different from the first communication channel when the communication abnormality of the first upper-level battery management system is detected by the communication abnormality detection unit.

In the system for managing the battery according to the embodiment of the present invention, the communication abnormality detection unit detects a communication abnormality if a signal is not received from the first upper-level battery management system through the first communication channel for a preset time, and the second communication channel is a preset communication channel.

In the system for managing the battery according to the embodiment of the present invention, through the second communication channel, a plurality of upper-level battery management systems different from the first upper-level battery management system are alternately and periodically connected to and communicate with each other.

The system for managing the battery according to the embodiment of the present invention further includes a control unit that allows the wireless communication unit to communicate with a second upper-level battery management system connected to the second communication channel when performing communication by changing to the second communication channel and allows a communication abnormality signal of the first upper-level battery management system to be transmitted, through the wireless communication unit, to the second upper-level battery management system through the second communication channel.

The system for managing the battery according to the embodiment of the present invention further includes a battery state measuring unit that measures a state of the battery, in which the control unit allows measured state-related data of the battery to be transmitted to the second upper-level battery management system through the wireless communication unit.

A system for managing a battery according to another embodiment of the present invention includes a wireless communication unit that communicates using a plurality of associated lower-level battery management systems disposed in a same battery rack through a third communication channel, a channel change unit that allows the wireless communication unit to communicate using a second communication channel different from the third communication channel for a preset time at a preset period, and a communication unit that transmits and receives data with an upper-level control unit.

The system for managing the battery according to the other embodiment of the present invention further includes a control unit that allows a communication abnormality signal to be sent by the wireless communication unit to the upper-level control unit if the wireless communication unit receives the communication abnormality signal from an upper-level battery management system of a non-associated lower-level battery management system.

In the system for managing the battery according to the other embodiment of the present invention, if the communication abnormality signal of the upper-level battery management system is received from the non-associated lower-level battery management system through the second communication channel, the control unit allows a command signal received from the upper-level control unit from before a preset time to be transmitted to the non-associated lower-level battery management system.

In the system for managing the battery according to the other embodiment of the present invention, the wireless communication unit receives battery measurement data measured by the lower-level battery management system from the non-associated lower-level battery management system, and transmits the battery measurement data to the upper-level battery management system.

A method for managing a battery according to another embodiment of the present invention includes detecting a communication abnormality of a first upper-level battery management system performing communication using a first communication channel and changing the first communication channel of a wireless communication unit to a second communication channel different from the first communication channel to perform communication when the communication abnormality of the first upper-level battery management system is detected in the detecting the communication abnormality.

In the method for managing the battery according to the other embodiment of the present invention, the communication abnormality is detected if a signal is not received from the first upper-level battery management system through the first communication channel for a preset time, and the second communication channel is a preset communication channel.

In the method for managing the battery according to the other embodiment of the present invention, through the second communication channel, a plurality of upper-level battery management systems different from the first upper-level battery management system are alternately and periodically connected to and communicate with each other.

The method for managing the battery according to the embodiment of the present invention further includes communicating with a second upper-level battery management system connected to the second communication channel when performing communication by changing to the second communication channel and transmitting a communication abnormality signal of the first upper-level battery management system to the second upper battery management system through the second communication channel.

In the method for managing the battery according to the embodiment of the present invention, measured battery state related data is transmitted to the second upper-level battery management system through the second communication channel, or a command from the upper-level controller is received from the second upper-level battery management system through the second communication channel.

Advantageous Effects

The present invention has an effect of maintaining continuity of communication without additional configuration even if a communication abnormality occurs when performing communication in a tree structure between upper-level and lower-level battery management systems.

BRIEF DESCRIPTION OF THE DRAWINGS

The following drawings attached to the specification illustrate preferred examples of the present invention by example, and serve to enable technical concepts of the present invention to be further understood together with detailed description of the invention given below, and therefore the present invention should not be interpreted only with matters in such drawings.

MODE FOR CARRYING OUT THE INVENTION

Figure 1:
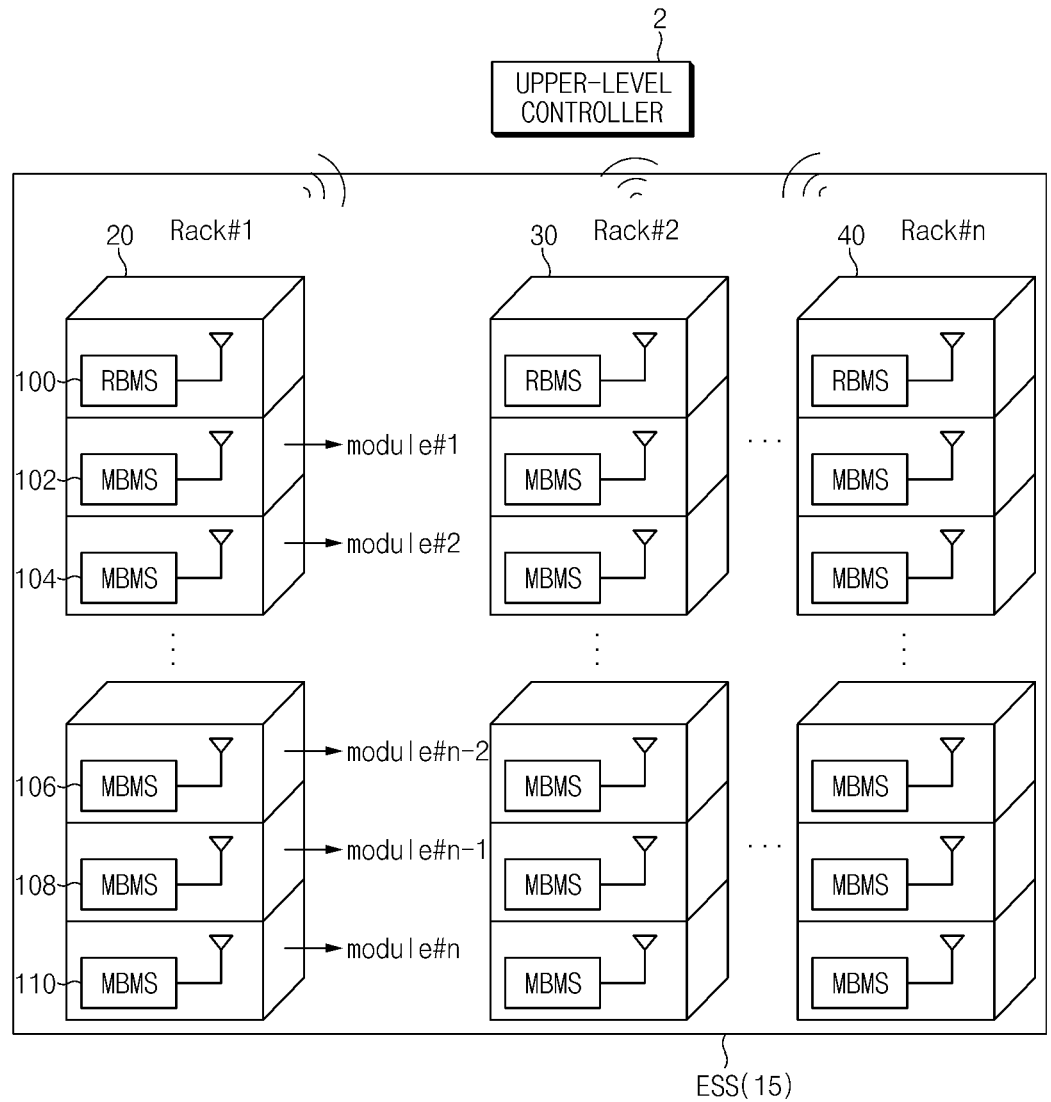
FIG. 1 is a diagram schematically illustrating a configuration of a plurality of battery racks in an ESS according to an embodiment of the present invention.

Hereinafter, various embodiments of the present invention will be described with reference to the accompanying drawings. However, this is not intended to limit the present invention to a specific embodiment, it should be understood to include various modifications, equivalents, and/or alternatives of the embodiments of the present invention. In connection with the description of the drawings, similar reference numerals may be used for similar constituent elements.

The terms used in this document are only used to describe a specific embodiment, and may not be intended to limit the scope of other embodiments. Singular expressions may include plural expressions unless the context clearly indicates otherwise. All terms used herein, including technical or scientific terms, may have the same meaning as generally understood by a person of ordinary skill in the art. Terms defined in a generally used dictionary may be interpreted as having the same or similar meaning as the meaning in the context of the related technology, and are not to be interpreted as an ideal or excessively formal meaning unless explicitly defined in this document. In some cases, even terms defined in this document cannot be interpreted to exclude embodiments of the present invention.

In addition, in describing the constituent elements of the embodiment of the present invention, terms such as first, second, A, B, (a), and (b) may be used. These terms are only for distinguishing the constituent element from other constituent elements, and the nature, sequence, or order of the component is not limited by the term. When a certain constituent element is described as being "connected", "coupled" or "linked" to another constituent element, but it should be understood that the constituent element may be directly connected or linked to the other component, but another component may be "connected", "coupled" or "linked" between the components.

FIG. 1 schematically illustrates a configuration of a plurality of battery racks in an ESS according to an embodiment of the present invention.

An ESS 15 includes a plurality of battery racks 20, 30, and 40, labeled Rack #1, Rack #2 and Rack #n, respectively. Each battery rack includes a plurality of battery modules 100 to 110 connected in series or in parallel.

Each of the battery modules 100 to 110 include a battery management system (BMS) that controls and monitors the battery module. In the BMS, there is an MBMS (module BMS) that controls and monitors each of the battery modules, and there is an RBMS (rack BMS) that controls a plurality of MBMS and transfers data received from the MBMS to an upper-level system. In addition, the RBMS may transmit a command received from the upper-level system to each battery module or a corresponding battery module. Here, the MBMS is a lower-level battery management system of RBMS, and the RBMS is an upper-level battery management system of MBMS.

Each MBMS monitors the battery status by sensing the temperature, voltage, and current of each battery module or each battery cell, and transmits monitored information data to the RBMS in a wireless or wired manner.

The RBMS that has received battery status information or status information data of the battery module from each MBMS can transmit this data directly to the upper-level controller, or can transmit information data obtained by determining a status of the battery module based on this data to the upper-level controller.

Figure 2:
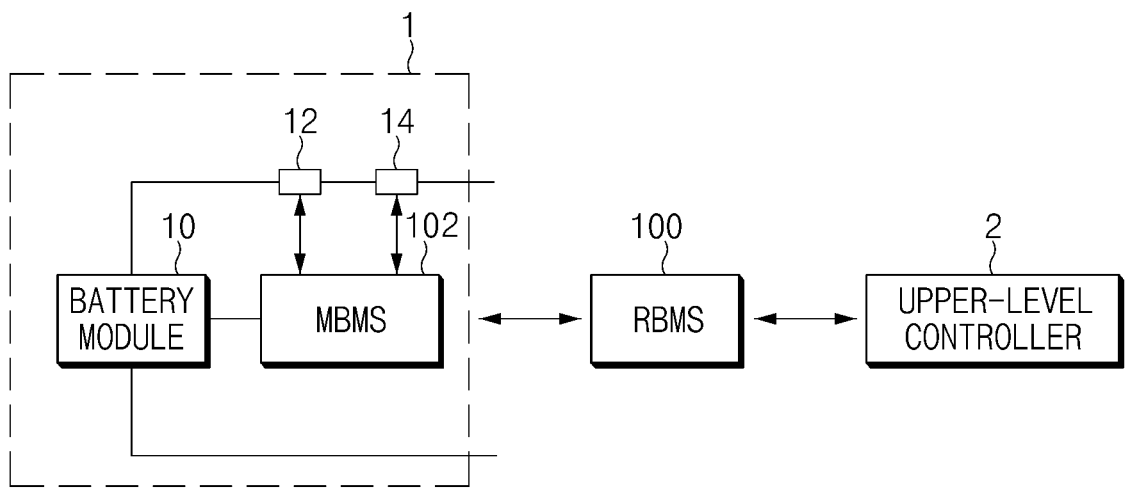
FIG. 2 is a block diagram illustrating a configuration of a system for managing a battery.

FIG. 2 schematically illustrates a communication connection between the upper-level battery management system and the lower-level battery management system.

The battery pack 1 includes a battery module 10 composed of one or more battery cells and is capable of being charged and discharged, a switching unit 14 connected in series to the positive (+) terminal side or the negative (−) terminal side of the battery module 10 to control a charge/discharge current flow of the battery module 10, and the MBMS 102 that monitors the voltage, current, temperature, etc. of the battery module 10 and controls and manages to prevent overcharging and overdischarging.

Here, the switching unit 14 is a semiconductor switching element for controlling the current flow for charging or discharging the battery module 10, and, for example, at least one MOSFET may be used as the switching unit 14.

In addition, the MBMS 102 can measure or calculate a voltage and current of a gate, source, drain, etc. of the semiconductor switching element 14 in order to monitor a voltage, current, temperature, etc. of the battery module 10, and can also measure the current, voltage, temperature, etc. of the battery module by using a sensor 12 provided adjacent to the semiconductor switching element 14. The MBMS 102 is an interface that receives values obtained by measuring the various parameters described above, and may include a plurality of terminals and a circuit connected to these terminals to perform processing of input values.

In addition, the MBMS 102 can control ON/OFF of the at least one MOSFET 14, and may be connected to the battery module 10 to monitor the state of the battery module 10.

Since the configuration of the battery pack 1 and the configuration of the MBMS 102 are known configurations, a more detailed description will be omitted.

Meanwhile, the MBMS 102 according to the embodiments of the present invention is connected to an upper-level RBMS 100, and the operation thereof may be controlled based on a signal applied from the upper-level BMS. In addition, the upper-level RBMS 100 may be connected to the upper-level controller 2. The operation of the upper-level RBMS 100 may also be controlled based on a signal applied from the upper-level controller 2.

Hereinafter, a configuration and method in which communication between the MBMS 102 and the upper-level controller 2 is performed when a communication abnormality occurs in the upper-level RBMS 100 will be described in detail.

Figure 3A:
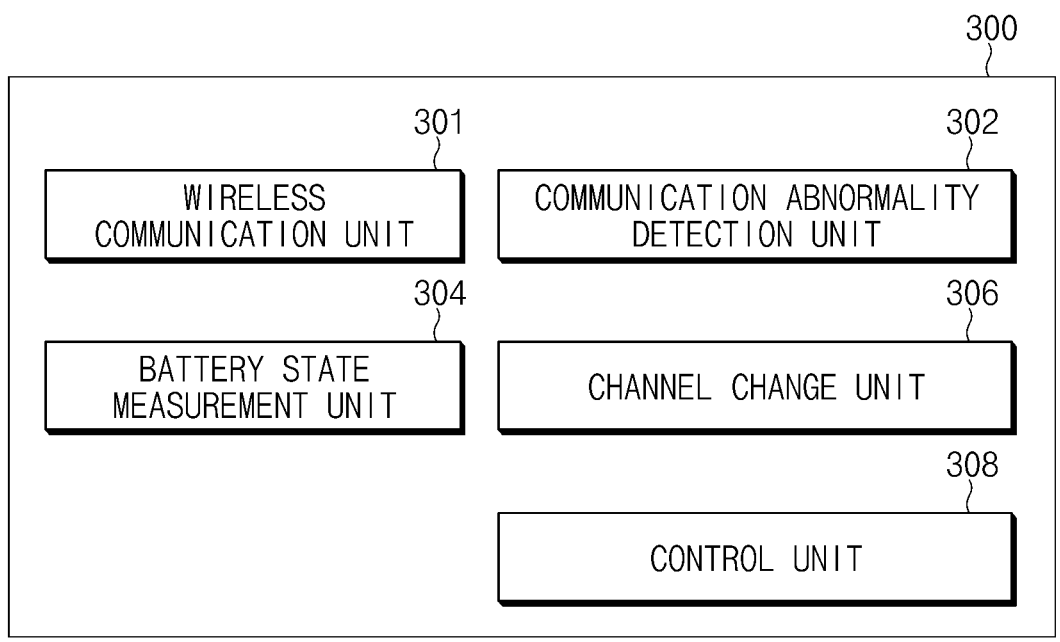
FIG. 3A is a configuration diagram of a battery module management system according to an embodiment of the present invention.

FIG. 3A is a configuration diagram of a battery module management system according to an embodiment of the present invention.

A battery module management system 300 corresponding to the MBMS 102 includes a wireless communication unit 301, a communication abnormality detection unit 302, a battery state measurement unit 304, a channel change unit 306, and a control unit 308.

The wireless communication unit 301 wirelessly communicates with a battery rack management system (corresponding to the RBMS 100), which is an upper-level battery management system that is located in the same battery rack as the respective battery module and controls by receiving various data from the respective battery module and transmitting the data to the upper-level controller 2 and receiving commands from the upper-level controller 2 and transmitting the commands to the battery module, through a preset first communication channel. Typically, the wireless communication unit 301 may receive a battery state measurement command or a battery state of charge (SOC) calculation command, etc. from the battery rack management system. Or, the wireless communication unit 301 may wirelessly transmit data related to the battery state, for example, battery voltage, current, or temperature data to the battery rack management system. Or, the wireless communication unit 301 transmits a battery abnormal signal to the battery rack management system through the first communication channel when it is determined that there is an abnormality in the battery. When there is an abnormality in the battery, it is necessary to take prompt action, and thus it is important that the battery abnormal signal is quickly transmitted to the upper-level controller 2 through the battery rack management system. However, if a communication abnormality of the battery rack management system (hereinafter referred to as a 'first battery rack management system'), which is an intermediate communication node, occurs and battery status data cannot be transferred to the upper-level controller 2 or the command received from the upper-level controller 2 cannot be received, the battery cannot be used efficiently and effectively. Therefore, when it is determined that a communication abnormality has occurred on the battery rack management system located in the same battery rack, the wireless communication unit 301 attempts communication through a second communication channel different from the first communication channel that has been used to communicate with the first battery rack management system.

When the communication abnormality occurs in the first battery rack management system, the battery module management systems attempt communication through the second communication channel with any other battery rack management system located in another battery rack in order to maintain communication continuity. Here, each of the battery rack management systems in the plurality of battery racks communicates with the battery module management system in the same battery rack through a predetermined channel, but periodically performs communication through the second communication channel for a predetermined time. Each of the plurality of battery rack management systems alternately performs communication through a second communication channel in each period. When the wireless communication unit 301 performs communication through the second communication channel due to a communication abnormality of the first battery rack management system while the plurality of battery rack management systems alternately performing communication through the second communication channel, the wireless communication unit 301 performs communication with a battery rack management system (hereinafter referred to as a 'second battery rack management system') performing communication through the second communication channel.

The wireless communication unit 301 transmits the communication abnormality signal of the first battery rack management system to the second battery rack management system through the second communication channel. In addition, the wireless communication unit 301 transmits the battery status data to the second battery rack management system through the second communication channel.

In addition, the wireless communication unit 301 receives various commands received from the upper-level controller 2 from the second battery rack management system through the second communication channel.

The communication abnormality detection unit 302 determines a communication abnormality of the battery rack management system in the same battery rack. All methods of determining communication abnormalities are included. For example, when a communication confirmation signal is periodically transmitted to the battery rack management system in the same rack, and a response signal to the corresponding communication confirmation signal is received, it is determined that there is no communication abnormality of the battery rack management system, and when the response signal is not received, it is determined that there is the communication abnormality of the corresponding battery rack management system.

Or, for example, the wireless communication unit 301 periodically receives a command from the battery rack management system, and if no signal is received from the corresponding battery rack management system for a predetermined time, the communication abnormality detection unit 302 determines that there is a communication abnormality of the corresponding battery rack management system.

The battery state measurement unit 304 is a configuration for measuring the state of the battery, and may include a configuration that measures the voltage, current, or temperature of the battery. In general, there are methods of measuring the battery voltage, for example, a method of using an operational amplifier and a method of using a relay and a capacitor. In addition, in general, battery current measurement may be performed using a current sensor corresponding to at least one of a current transformer method, a hall element method, and a fuse method. Also, in general, the battery temperature measurement can be measured by, for example, a thermistor. Thermistor is a semiconductor element obtained by combining oxides such as manganese, nickel, copper, cobalt, chromium, and iron to be mixed and sintered, and is an element having a characteristic that an electrical resistance value changes according to temperature. For example, the thermistor may be a positive temperature coefficient thermistor (PTC) having temperature and resistance values having a proportional characteristic, a negative temperature coefficient thermistor (NTC) having temperature and resistance values having an inverse proportional characteristic, and a critical temperature resistor in which a resistance value rapidly changes at a specific temperature.

The voltage, current, or temperature data of the battery measured by the battery state measurement unit 304 may be transmitted to a battery rack management system, which is an upper-level battery management system. In addition, a battery SOC may be calculated using the battery voltage, current, or temperature data measured by the battery state measurement unit 304, and battery abnormality determination may be performed using the calculated battery SOC information. The battery SOC or a battery abnormality signal determined based on the battery SOC is transmitted to the battery rack management system, which is the upper-level battery management system.

The channel change unit 306 allows the wireless communication unit 301 to perform communication through a preset second communication channel when the communication abnormality of the battery rack management system in the same battery rack is detected by the communication abnormality detection unit 302. When the corresponding battery rack management system has a communication abnormality, the channel change unit 306 stores second communication channel information so that the wireless communication unit 301 can perform communication through the second communication channel.

When the communication abnormality detection unit 302 detects the communication abnormality of the corresponding battery rack management system, the control unit 308 receives the communication abnormality signal of the corresponding battery rack management system from the communication abnormality detection unit 302. When the control unit 308 receives the communication abnormality signal from the corresponding battery rack management system from the communication abnormality detection unit 302, the control unit 308 causes the wireless communication unit 301 to transmit data including information that a communication abnormality of the corresponding battery rack management system has occurred to the battery rack management system of another battery rack through the second communication channel.

Figure 3B:
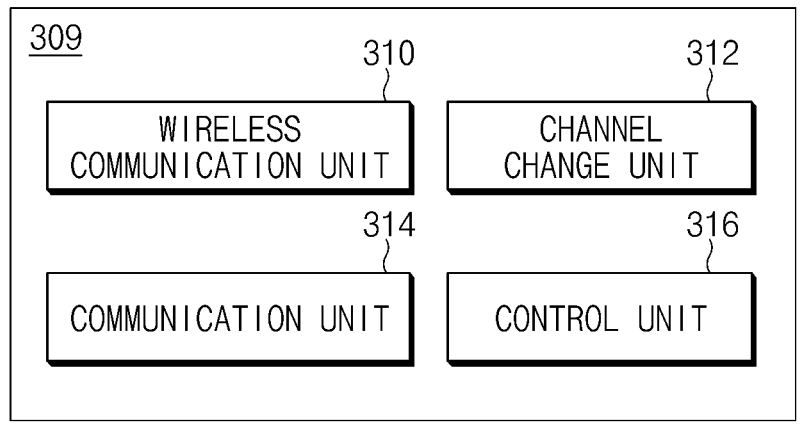
FIG. 3B is a configuration diagram of a battery rack management system to an embodiment of the present invention.

FIG. 3B is a configuration diagram of a battery rack management system according to an embodiment of the present invention.

The battery rack management system 309 includes a wireless communication unit 310, a channel change unit 312, a communication unit 314, and a control unit 316.

The wireless communication unit 310 basically performs wireless communication with the battery module management system in the same rack through a preset communication channel, for example, a third communication channel. The wireless communication unit 310 transmits commands received from the upper-level controller 2 to a battery module in the same battery rack through the third communication channel.

The wireless communication unit 310 performs communication through the second communication channel, which is the preset communication channel, for a predetermined time at a preset period. The wireless communication unit 310 can perform communication with the battery module management system 300 disposed in another battery rack through the second communication channel. In this case, as described above, when a communication abnormality occurs in the battery rack management system in the same battery rack, the battery module management system 300 disposed in another battery rack, the battery module management system 300 attempts communication by changing a channel to a preset communication channel, for example, the second communication channel. In this case, through the preset second communication channel, each of the battery rack management systems disposed in a plurality of other racks alternately performs communication by changing to the second communication channel for a preset time at a preset period. When the battery module management system 300 for which a communication abnormality occurs in the upper-level battery management system changes to the second communication channel to perform communication, the battery module management system 300 may perform communication with a battery rack management system, which is in communication through the second communication channel, among other plurality of battery rack management systems.

That is, when the communication abnormality occurs in the battery rack management system of another battery rack, the wireless communication unit 310 can perform communication with the battery module management system 300 in the corresponding battery rack, and receive a communication abnormality signal of the battery rack management system in the corresponding battery rack from the battery module management system 300 through the second communication channel. In addition, the wireless communication unit 310 can receive battery status information data from the battery module management system 300 in the battery rack, in which the communication abnormality has occurred, through the second communication channel. In addition, if there is a command, which is received from the upper-level controller 2 for a certain time before the communication connection is established through the second communication channel to the battery module management system 300, in the battery rack in which a communication abnormality has occurred, the wireless communication unit 310 transmits the corresponding commands to the battery module management system 300 through the second communication channel.

The channel change unit 312 changes the communication channel of the wireless communication unit 310. The wireless communication unit 310 usually performs communication with battery module management systems in the same battery rack through a third communication channel. However, when the communication abnormality occurs in the battery module management system in another specific battery rack and communication with the corresponding battery rack management system is impossible, communication continuity can be maintained by changing to a specific channel, for example, the second communication channel, and attempting communication with a battery rack management system of another battery rack. In this time, in order to perform communication with the battery module management system disposed in another battery rack that attempts communication by changing to the second communication channel, the battery rack management systems in a battery rack other than a battery rack, in which the communication abnormality has occurred, perform communication by alternately and periodically changing to the second communication channel.

Accordingly, the channel change unit 312 changes the communication channel of the wireless communication unit 310 to perform communication through a preset communication channel for a preset time at a preset period.

The communication unit 314 performs communication with the upper-level controller 2. The communication unit 314 may be a wireless communication unit or a wired communication unit. In the case of the wireless communication unit, it may be used by being integrated with the wireless communication unit 310.

The communication unit 314 transmits battery status information received from the battery module management system in the same battery rack received by the wireless communication unit 310 to the upper-level controller 2.

In addition, the communication unit 314 receives control commands from the upper-level controller 2.

In addition, the communication unit 314 transmits the communication abnormality signal and battery status data of the battery rack management system received from the battery module management system 300 in another battery rack by the wireless communication unit 310 to the upper-level controller 2 through the second communication channel.

When the communication abnormality signal of the battery rack management system is received from the non-associated battery module management system through the second communication channel, the control unit 316 causes the wireless communication unit 310 to transmit a command signal, which has been received from the upper-control unit from before a preset time, to a battery module management system which is not associated by being disposed in another battery rack.

Figure 4:
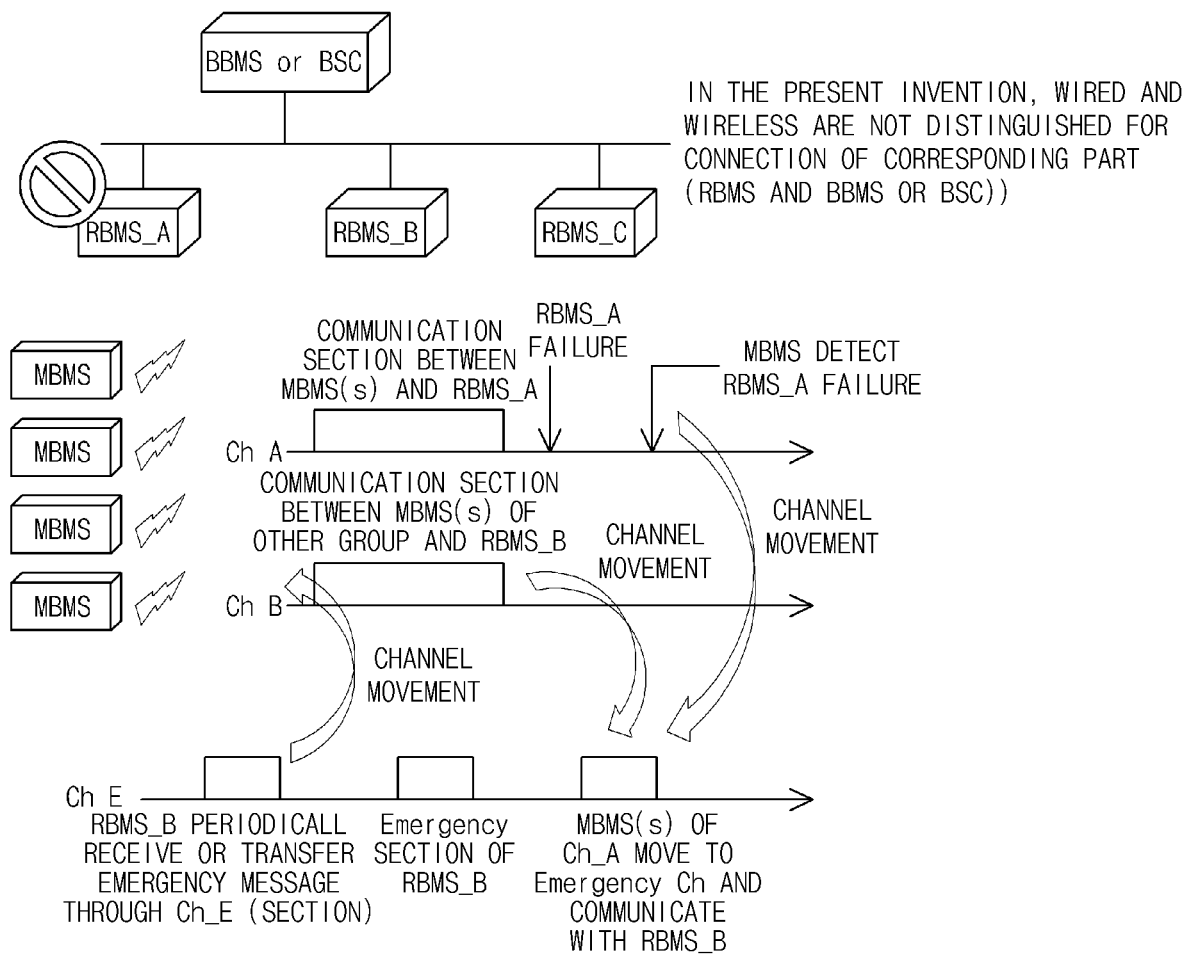
FIG. 4 is a diagram illustrating an example of moving a simple communication channel movement between the systems for managing a battery according to an embodiment of the present invention.

FIG. 4 illustrates an example of a communication channel between the systems for managing a battery according to an embodiment of the present invention.

BBMS (BANK BMS) is communicatively connected to RBMS_A, RBMS_B, and RBMS_C through CAN communication. In this case, a wired connection through CAN communication is established, but it may be wirelessly connected.

Each RBMS performs wireless communication with a plurality of MBMSs disposed in each battery rack. Each RBMS wirelessly communicates with each of the plurality of MBMSs disposed in each rack through each set communication channel.

For example, RBMS_A communicates wirelessly through channel A (ch A) with the plurality of MBMSs in the same battery rack. RBMS_A can transmit various command signals, such as a control command or a monitoring command, etc. received from BBMS which is an upper-level controller, to MBMS, a lower-level battery management system, respectively, through channel A. In addition, each MBMS can also transmit battery status information or battery abnormality information, etc. to RBMS_A through channel A.

However, MBMSs in the same battery rack as RBMS_A transmit and receive signals to and from BBMS, which is an upper-level controller, through only RBMS_A, through channel A. However, if a communication abnormality occurs in RBMS_A, MBMSs that performed communication with BBMS through RBMS_A become in a communication disabled state.

Therefore, in order to eliminate the communication disabled state of these MBMSs, a separate channel is formed to communicate by changing the channel to, for example, channel E (Ch E), so that MBMSs can communicate with the battery rack management system of another battery rack.

Specifically, each of the plurality of RBMSs performs communication by periodically connecting to a preset emergency channel, for example, channel E (Ch E) as the second communication channel described above, while basically performing communication with the MBMS in the corresponding battery rack through a set communication channel A plurality of RBMSs alternately perform communication through channel E. MBMSs whose communication is disabled due to a communication abnormality of RBMS_A can detect the communication abnormality of RBMS_A and changes the communication channel to channel E, and can perform communication with RBMS_B of another battery rack which is in communication through channel E at that time.

Through channel E, the plurality of MBMSs in a communication disabled state can receive a command from BBMS, which is an upper-level controller, or transmit battery status information or battery abnormality information through RBMS_B of another battery rack without a communication short circuit.

Figure 5:
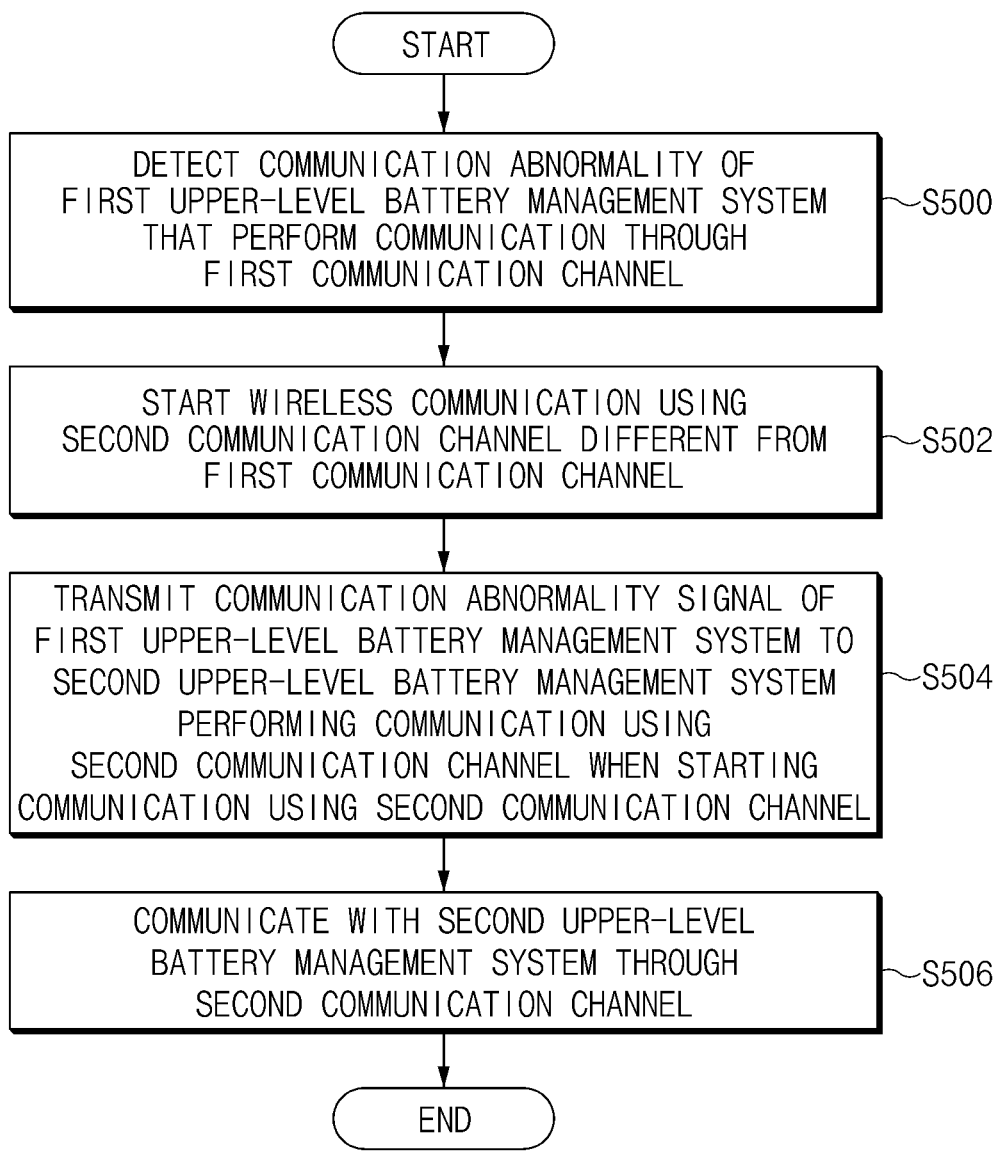
FIG. 5 is a flowchart of a method for managing a battery according to an embodiment of the present invention.

FIG. 5 is a flowchart of a method for managing a battery according to an embodiment of the present invention.

The battery module management system 300, which is a lower-level battery management system, detects a communication abnormality of a battery rack management system, which is a first upper-level battery management system that wirelessly performs communication through a first communication channel (S500). The battery rack management system in the same battery rack as the battery module management system 300 is a system associated with the battery module management system, and the battery rack management system in another battery rack is a system not associated with the battery module management system.

For example, a communication confirmation signal is periodically transmitted to the battery rack management system in the same rack, and when a response signal to the communication confirmation signal is received, it is determined that there is no communication abnormality of the corresponding battery rack management system, and when the response signal is not received, it is determined that there is a communication abnormality in the corresponding battery rack management system.

Or, for example, the wireless communication unit 301 periodically receives a command from the corresponding battery rack management system, and when no signal is received from the corresponding battery rack management system for a predetermined time, the abnormality detection unit 302 determines that there is a communication abnormality in the corresponding battery rack management system.

The battery module management system 300 starts wireless communication using a second communication channel different from the first communication channel (S502).

The second communication channel is a preset channel, and is a channel through which battery rack management systems of other racks periodically change channels to perform wireless communication.

Accordingly, when the battery module management system 300 start communication using the second communication channel, the battery module management system 300 transmits a communication abnormality signal of the first upper battery management system to the second upper battery management system performing communication using the second communication channel (S504).

The second upper-level battery management system is a battery rack management system which is performing communication through the second communication channel when the battery module management system 300 performs communication using the second communication channel.

The battery module management system 300 communicates with the second upper-level battery management system through the second communication channel (S506).

The wireless communication unit 301 transmits the battery status data to the second battery rack management system through the second communication channel. In addition, the wireless communication unit 301 receives various commands received from the upper-level controller from the second battery rack management system through the second communication channel.

Figure 6:
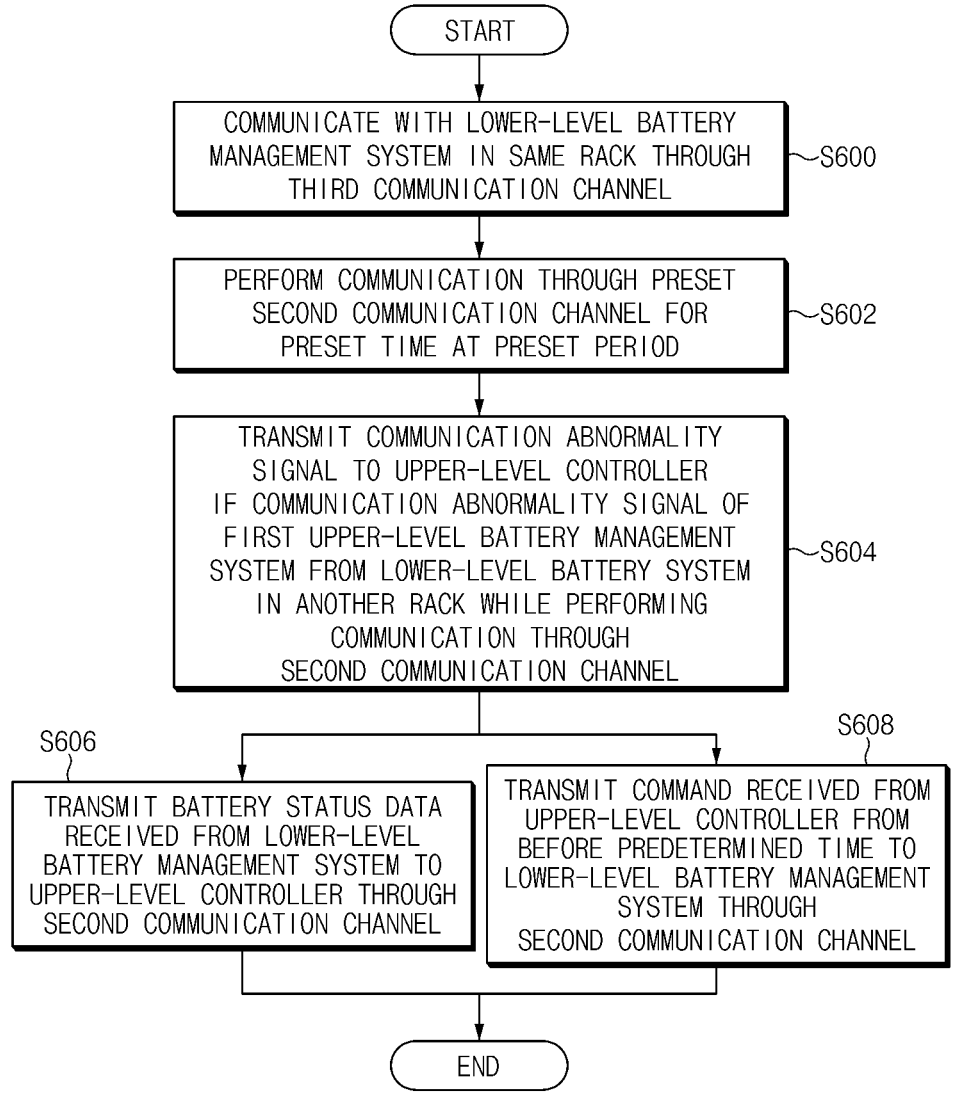
FIG. 6 is a flowchart of a method for managing a battery according to an embodiment of the present invention.

FIG. 6 is a flowchart of a method for managing a battery according to an embodiment of the present invention.

The battery rack management system 309 communicates with a lower-level battery management system, which is a battery module management system in the same battery rack, through a third communication channel (S600).

The wireless communication unit 310 of the battery rack management system typically performs wireless communication with the battery module management system in the same battery rack through a preset communication channel, for example, a third communication channel. The wireless communication unit 310 transmits commands received from an upper-level controller to a battery module in the same battery rack through the third communication channel.

In addition, the battery rack management system 309 performs communication through a preset second communication channel for a preset time at a preset period (S602).

The wireless communication unit 310 of the battery rack management system 309 performs communication through the second communication channel which is the preset communication channel for a predetermined time at a preset period.

If the battery rack management system 309 receives a communication abnormality signal of the first upper-level battery management system from a lower-level battery system in another battery rack while performing communication through the second communication channel, the communication abnormality signal is transmitted to the upper-level controller (S604).

That is, when a communication abnormality of the battery rack management system of another battery rack occurs, the wireless communication unit 310 can perform communication with the battery module management system 300 in the corresponding rack and receives the communication abnormality signal of the battery rack management system in the corresponding rack from the battery module management system 300 through the second communication channel.

The battery rack management system 309 transmits the battery status data received from the lower-level battery management system to the upper-level controller through the second communication channel (S606).

Specifically, the wireless communication unit 310 of the battery rack management system 309 can receive battery status information data from the battery module management system 300 in the battery rack in which the communication abnormality has occurred through the second communication channel.

In addition, the battery rack management system 309 transmits the command received from the upper-level controller from before a predetermined time to the battery module management system, which is a lower-level battery management system, through the second communication channel (S608)

If there is the command received from the upper-level controller 2 for a predetermined time before the communication connection is established through the second communication channel to the battery module management system 300 in the battery rack where a communication abnormality has occurred, the wireless communication unit 310 of the battery rack management system 309 transmits corresponding commands to the battery module management system 300 through the second communication channel.

Figure 7:
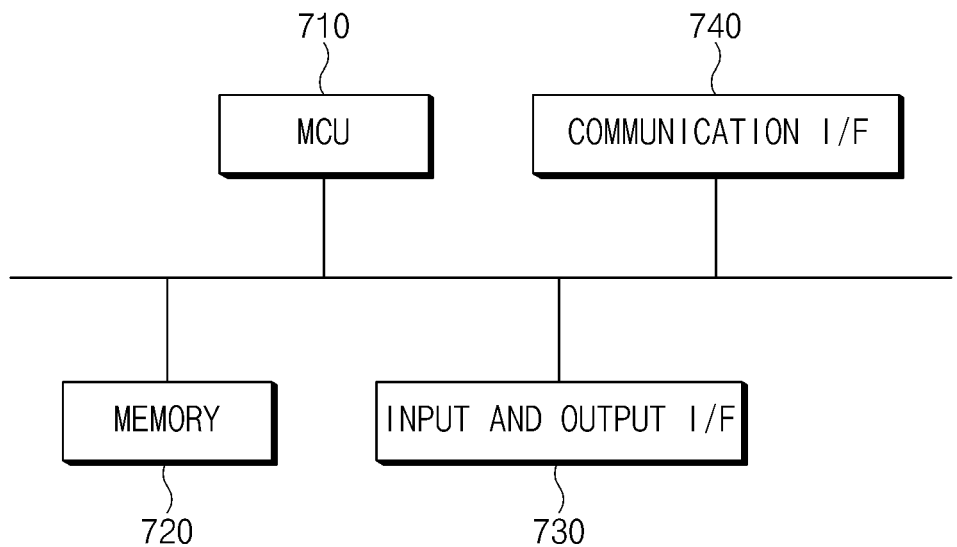
FIG. 7 is a block diagram illustrating a hardware configuration of the system for managing the battery according to the embodiment of the present invention.

FIG. 7 is a block diagram illustrating a hardware configuration of the system for managing the battery according to the embodiment of the present invention.

A system 700 for managing a battery may include a microcontroller (MCU) 710 that controls various processes and configurations, a memory 720 in which an operating system program and various programs (e.g., a battery pack abnormality diagnosis program or a battery pack temperature estimation program), etc. are recorded, an input and output interface 730 that provides an input interface and an output interface between the battery cell module and/or the semiconductor switching element, and a communication interface 740 capable of performing communication with the outside through a wired or wireless communication network. In this way, the computer program according to the present invention is recorded in the memory 720 and processed by the microcontroller 710, thereby capable of being implemented as a module that performs the respective functional blocks illustrated in FIGS. 3A and 3B.

In this specification, reference to 'one embodiment' of the principles of the present invention and various modifications of such expression, in connection with this embodiment, means that a particular feature, structure, characteristic, etc. are included in at least one embodiment of the principles of the present invention. Accordingly, the expression 'in one embodiment' and any other modified examples disclosed throughout this specification are not necessarily all referring to the same embodiment.

All embodiments and conditional examples disclosed through the present specification are described with the intention of helping a person skilled in the art with ordinary knowledge in the technical field of the present invention understand the principles and concepts of the present invention. It will be understood that the present invention may be implemented in a modified form without departing from the essential characteristics of the present invention. Therefore, the disclosed embodiments should be considered from an illustrative point of view rather than a limiting point of view. The scope of the present invention is set forth in the claims rather than the description described above, and all differences within the scope equivalent thereto should be construed as being included in the present invention.

The invention claimed is:

1. A system for managing a battery, the system comprising:
    a wireless communication unit that communicates with a first upper-level battery management system performing communication using a first communication channel;
    a communication abnormality detection unit that detects a communication abnormality of the first upper-level battery management system; and
    a channel change unit that changes a communication channel of the wireless communication unit to a second communication channel different from the first communication channel based on the communication abnormality of the first upper-level battery management system being detected by the communication abnormality detection unit,
    wherein the communication abnormality detection unit detects the communication abnormality if a signal is not received from the first upper-level battery management system through the first communication channel for a preset time.

2. The system of claim 1,
    wherein the second communication channel is a preset communication channel.

3. The system of claim 1,
    wherein, through the second communication channel, a plurality of upper-level battery management systems different from the first upper-level battery management system are alternately and periodically connected to and communicate with each other.

4. The system of claim 3, further comprising:
    a control unit that allows the wireless communication unit to communicate with a second upper-level battery management system connected to the second communication channel when performing communication by changing to the second communication channel and allows a communication abnormality signal of the first upper-level battery management system to be transmitted, through the wireless communication unit, to the second upper-level battery management system through the second communication channel.

5. The system of claim 4, further comprising a battery state measuring unit that measures a state of the battery,
    wherein the control unit allows measured state-related data of the battery to be transmitted to the second upper-level battery management system through the wireless communication unit.

6. A system for managing a battery, the system comprising:
    a wireless communication unit that communicates using a plurality of associated lower-level battery management systems disposed in a same battery rack through a third communication channel;
    a channel change unit that allows the wireless communication unit to communicate using a second communication channel different from the third communication channel for a preset time at a preset period;
    a communication unit that transmits and receives data with an upper-level control unit; and
    a control unit that allows a communication abnormality signal to be sent by the wireless communication unit to the upper-level control unit if the wireless communication unit receives the communication abnormality signal from an upper-level battery management system of a non-associated lower-level battery management system.

7. The system of claim 6,
    wherein if the communication abnormality signal of the upper-level battery management system is received from the non-associated lower-level battery management system through the second communication channel, the control unit allows a command signal received from the upper-level control unit from before a preset time to be transmitted to the non-associated lower-level battery management system.

8. The system of claim 6,
    wherein the wireless communication unit receives battery measurement data measured by the non-associated lower-level battery management system, and transmits the battery measurement data to the upper-level battery management system.

9. A method for managing a battery, the method comprising:
   detecting a communication abnormality of a first upper-level battery management system performing communication using a first communication channel; and
   changing the first communication channel of a wireless communication unit to a second communication channel different from the first communication channel to perform communication when the communication abnormality of the first upper-level battery management system is detected in the detecting the communication abnormality,
   wherein the communication abnormality is detected if a signal is not received from the first upper-level battery management system through the first communication channel for a preset time.

10. The method of claim 9,
    wherein the second communication channel is a preset communication channel.

11. The method of claim 9,
    wherein, through the second communication channel, a plurality of upper-level battery management systems different from the first upper-level battery management system are alternately and periodically connected to and communicate with each other.

12. The method of claim 11, further comprising:
    communicating with a second upper-level battery management system connected to the second communication channel when performing communication by changing to the second communication channel; and
    transmitting a communication abnormality signal of the first upper-level battery management system to the second upper-level battery management system through the second communication channel.

13. The method of claim 12,
    wherein measured battery state related data is transmitted to the second upper-level battery management system through the second communication channel, or a command from an upper-level controller is received from the second upper-level battery management system through the second communication channel.

14. The method of claim 13, wherein the command from the upper-level controller is transmitted from the second upper-level battery management system through the second communication channel to a lower-level battery management system included in a same system as the first upper-level battery management system.

15. The system of claim 4, wherein a command transmitted to the second upper-level battery management system by an upper-level controller is transmitted through the second communication channel to the wireless communication unit.

\* \* \* \* \*